United States Patent [19]

Klingbeil, Jr. et al.

[11] Patent Number: 5,688,703
[45] Date of Patent: Nov. 18, 1997

[54] METHOD OF MANUFACTURING A GATE STRUCTURE FOR A METAL SEMICONDUCTOR FIELD EFFECT TRANSISTOR

[75] Inventors: Lawrence S. Klingbeil, Jr., Chandler; Marino J. Martinez, Phoenix, both of Ariz.

[73] Assignee: Motorola, Inc., Schaumburg, Ill.

[21] Appl. No.: 523,710

[22] Filed: Sep. 5, 1995

[51] Int. Cl.⁶ .................................................. H01L 21/338
[52] U.S. Cl. .................... 437/41; 437/39; 437/176; 437/912; 148/DIG. 105; 148/DIG. 140
[58] Field of Search ............... 437/40 SH, 41 SH, 437/912, 176, 39; 148/DIG. 140, DIG. 105

[56] References Cited

U.S. PATENT DOCUMENTS

| | | |
|---|---|---|
| 4,612,560 | 9/1986 | Dortu et al. |
| 4,642,879 | 2/1987 | Kawata et al. ............ 148/DIG. 140 |
| 4,863,879 | 9/1989 | Kwok ............................ 437/41 |
| 5,447,874 | 9/1995 | Grivna et al. ................. 437/40 |
| 5,484,740 | 1/1996 | Cho ........................... 437/40 SH |
| 5,496,748 | 3/1996 | Hattori et al. .................. 437/912 |

FOREIGN PATENT DOCUMENTS

| | | | |
|---|---|---|---|
| 9135773 | 8/1984 | Japan | 437/39 |
| 0136267 | 7/1985 | Japan | |
| 62-16573 | 1/1987 | Japan | 437/40 SH |
| 62-92327 | 4/1987 | Japan | |
| 2272571 | 11/1987 | Japan | |
| 2276832 | 12/1987 | Japan | |
| 64-24466 | 1/1989 | Japan | |
| 1244666 | 9/1989 | Japan | |
| 6045293 | 2/1994 | Japan | 437/176 |

*Primary Examiner*—Charles L. Bowers, Jr.
*Assistant Examiner*—Toniae M. Thomas
*Attorney, Agent, or Firm*—William E. Koch; George C. Chen

[57] ABSTRACT

A method of manufacturing a gate structure (19) for a semiconductor device (10) utilizes a dielectric layer (17) containing aluminum to protect the surface of a substrate (11) from residues resulting from deposition and etching of the gate structure (19). The gate structure (19) forms a refractory contact to the substrate (11), and the source and drain regions (26) are self-aligned to the gate structure (19). Semiconductor devices manufactured using methods in accordance with the present invention are observed to have a higher breakdown voltage and a higher transconductance, among other improved electrical performance characteristics.

19 Claims, 3 Drawing Sheets

5,688,703

METHOD OF MANUFACTURING A GATE STRUCTURE FOR A METAL SEMICONDUCTOR FIELD EFFECT TRANSISTOR

BACKGROUND OF THE INVENTION

This invention relates, in general, to a method of fabricating a semiconductor device, and more particularly, to a method of using a dielectric layer containing aluminum.

Gate electrode formation for metal-semiconductor field effect transistors (MESFETs) and heterostructure field effect transistors (HFETs) conventionally involves depositing a refractory metal on a semiconductor substrate and using a reactive ion etch (RIE) process to etch a portion of the refractory metal off of the semiconductor substrate. However, residues from the refractory metal and from the chemicals used in the RIE process may be left on the semiconductor substrate and cause electrical anomalies such as high leakage currents or low breakdown voltage in the resulting semiconductor device. Furthermore, the surface of the semiconductor substrate is damaged during its exposure to the RIE process which further degrades the electrical performance of the semiconductor device.

Accordingly, a need exists for a method of manufacturing a gate structure for a semiconductor device which does not leave residues on the surface of the semiconductor substrate, which does not damage the semiconductor substrate during etching of the gate structure, which does not degrade the electrical performance of the semiconductor device, and which is compatible with existing process flows.

DETAILED DESCRIPTION OF THE DRAWINGS

The present invention relates to a method of forming a gate structure which utilizes a dielectric layer containing a metal such as aluminum or the like to protect the surface of a semiconductor substrate during deposition and etching of the gate structure. In the preferred embodiment, the gate structure forms a refractory contact to the semiconductor substrate, and the source and drain regions of the semiconductor device are self-aligned to the gate structure. Semiconductor devices manufactured using the processes of the subject invention are observed to have tighter gate length control, a higher breakdown voltage, and a higher transconductance, among other improved electrical performance characteristics such as lower leakage currents, reduced transients and the like.

Figure 1:
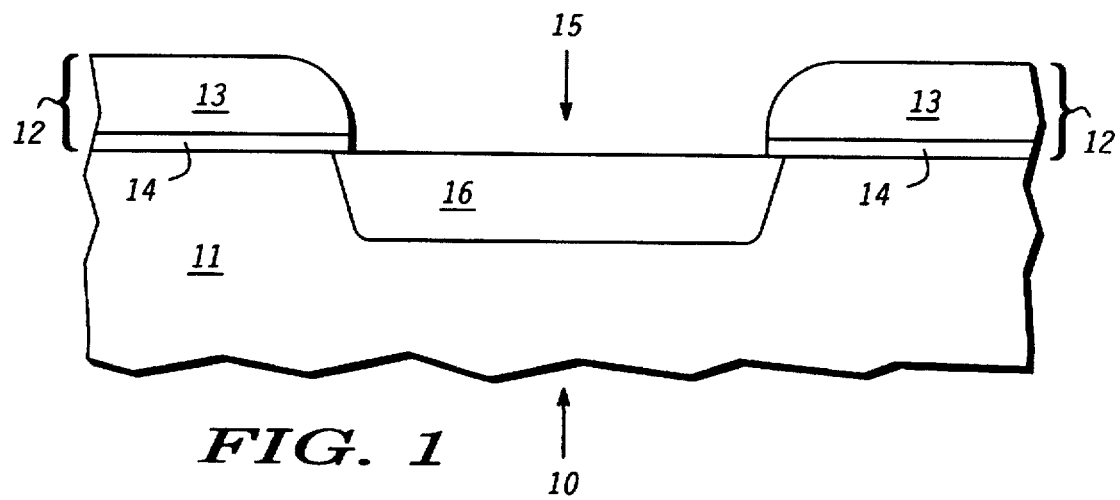
FIGS. 1–6 illustrate an enlarged, cross-sectional view of process steps for manufacturing a gate structure for a semiconductor device in accordance with the present invention.

Turning to the figures for a more detailed description, FIG. 1 illustrates an enlarged, cross-sectional view of a preliminary process step for manufacturing a gate structure for a semiconductor device in accordance with the present invention. FIG. 1 depicts a substrate 11 which is preferably comprised of a compound semiconductor material including, but not limited to, gallium arsenide, aluminum gallium arsenide, indium gallium arsenide, and indium phosphide. First, a dielectric layer 14 is disposed over substrate 11 to prevent outgassing of substrate 11 at elevated temperatures. While dielectric layer 14 preferably comprises silicon nitride, other dielectric layers which prevent outgassing can also be used. Dielectric layer 14 can be disposed over substrate 11 using chemical vapor deposition (CVD) and preferably has a thickness of approximately 100 angstroms (Å) to 1,000 Å in order to prevent outgassing of substrate 11 during subsequent high temperature processing steps.

Next, a dielectric layer 13 is disposed over dielectric layer 14. Dielectric layer 13 preferably comprises silicon dioxide because of its common usage and wide availability, but other materials such as silicon oxynitride, for example, can also be used. Similar to dielectric layer 14, dielectric layer 13 can be deposited using CVD. The preferred thickness of dielectric layer 13 is approximately 1,000 Å to 7,000 Å in order to stop ions from penetrating substrate 11 during a subsequent ion implantation process described below.

Dielectric layers 13 and 14 comprise a dielectric stack 12. A portion of dielectric stack 12 is removed to expose a portion 15 of substrate 11. Portion 15 defines an active area for a semiconductor device 10. Removal of dielectric layer 13 in the portion of dielectric stack 12 can be accomplished by using a patterned photoresist layer and a dry etch such as a reactive ion etch (RIE), a wet etch, or a combination of both dry and wet etches. In an RIE process, a fluorine based plasma comprising $C_2F_6$, $SF_6$, $NF_3$, $CF_4$, $CHF_3$, among others is preferably used to maintain controllability of sidewall slope or anisotropy. In a wet etch, a solution containing buffered hydroflouric acid (HF), for example, can be used.

Removal of dielectric layer 14 in the portion of dielectric stack 12 can be accomplished by using a wet etchant or a low power plasma comprising $SF_6$, $NF_3$, or other etchants suitable for use at a low power. A low power plasma of preferably approximately 100 to 200 watts reduces the damage created on the surface of substrate 11 compared to a high power plasma. A damaged surface of substrate 11 creates electrically active defects which can degrade the performance of semiconductor device 10 by creating high contact resistance, high ideality, low Schottky barrier height, and other electrical performance anomalies. Generally, a higher power plasma is used to etch dielectric layer 13 compared to dielectric layer 14.

After etching dielectric stack 12 to expose portion 15 of substrate 11, an ion implantation process is used to dope an active area or channel region 16 of semiconductor device 10. Dielectric stack 12 is used to define a width of channel region 16 by blocking the implanted ions. Multiple species of ions including, but not limited to, silicon and beryllium can be implanted into channel region 16 to form an n-type or p-type doped region. If substrate 11 contains multiple channel regions requiring different doping concentrations, a photoresist layer can be patterned over substrate 11 to permit ion implantation into specific channel regions while blocking the ion implantation from other channel regions.

Figure 2:
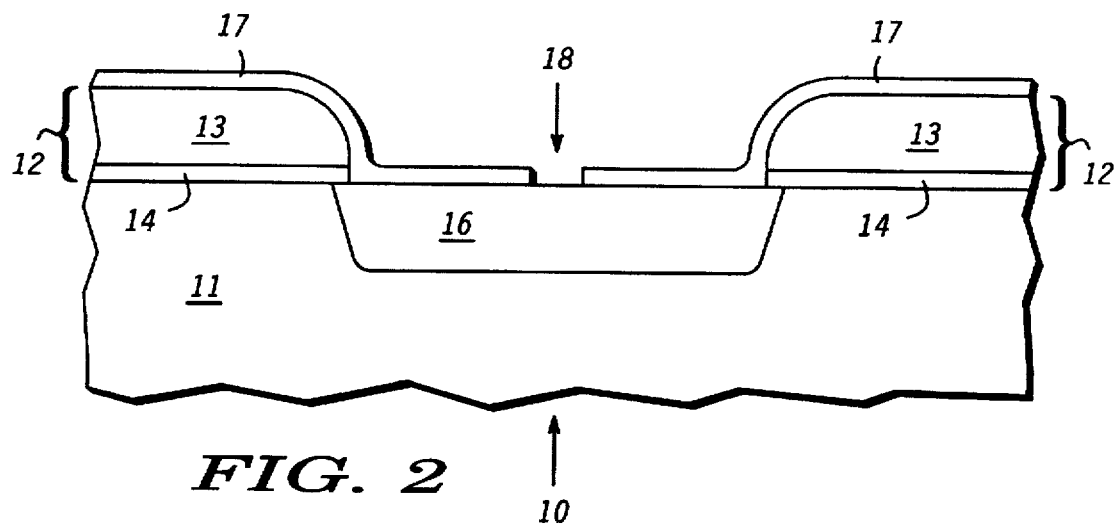

Continuing with FIG. 2, a dielectric layer 17 comprised of a metal, preferably aluminum, is provided over substrate 11. Dielectric layer 17 is most preferably an electrically insulating layer of aluminum nitride. Dielectric layer or electrically insulating layer 17 is preferably provided by reactively sputtering aluminum using argon and nitrogen gases at room temperature. Other processes such as metal organic chemical vapor deposition can also be used. Dielectric layer 17 has a thickness preferably less than about 500 Å. The reasons for the thickness range are disclosed below during the discussion of FIG. 3.

An opening 18 is formed in dielectric layer 17 to expose a portion of channel region 16 of substrate 11 as portrayed in FIG. 2. Opening 18 is formed by patterning a layer of photoresist over dielectric layer 17 and removing an exposed portion of dielectric layer 17 preferably using ammonium hydroxide ($NH_4OH$). Most preferably, the wet etch chemistry comprises $NH_4OH:H_2O$ (1:9) and is used at a high flow rate and at room temperature for a specified time. Other $NH_4OH:H_2O$ ratios ranging from 1:1 to 1:50 and other temperatures ranging from 20 degrees Celsius (° C.) to 50° C. can also be used. While other etchants such as KOH, $H_3PO_4$, HF, or HCl can be used, $NH_4OH:H_2O$ is preferred due to its compatibility with gallium arsenide and its reproducible etch rate. The etchants used to form opening 18 should not damage the underlying substrate 11. The formation of opening 18 preferably occurs prior to exposing dielectric layer 17 to any temperatures greater than approximately 500° C. which makes removal of dielectric layer 17 from substrate 11 difficult when using $NH_4OH$ as an etchant.

Figure 3:
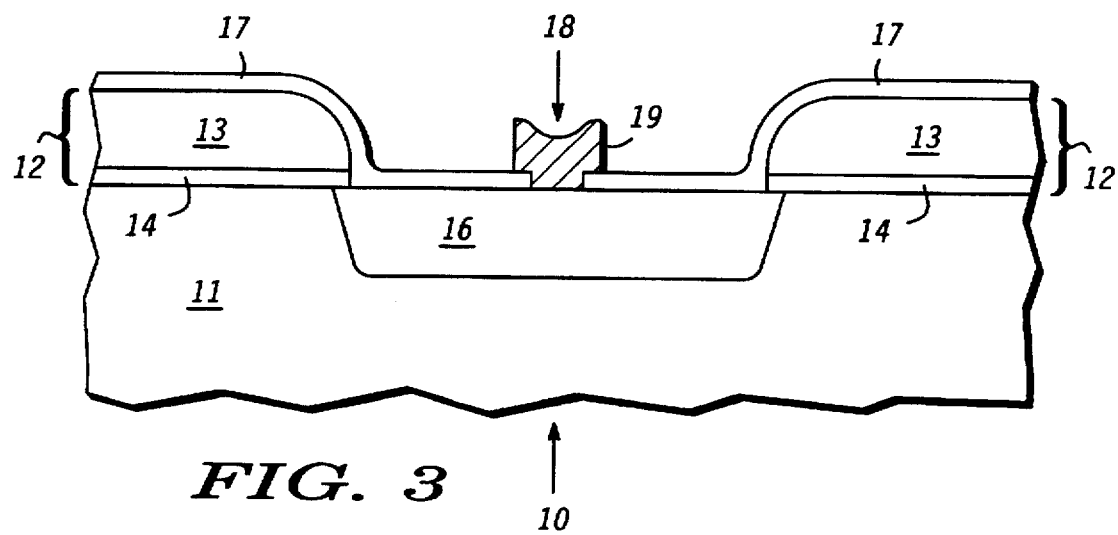

Referring now to FIG. 3, a gate layer 19 is disposed on dielectric layer 17, over opening 18, and over channel region 16 and is etched to form a gate structure. Gate layer or gate structure 19 comprises an electrically conductive material, preferably a refractory metal such as titanium tungsten nitride, tungsten silicon, tungsten nitride, tungsten silicon nitride, among others. Gate structure or electrically conductive material 19 preferably has a thickness of approximately 1,000 Å to 5,000 Å. Gate structure or electrically conductive structure 19 can be disposed over substrate 11 using reactive sputtering of titanium and tungsten using argon and nitrogen gases. Gate structure 19 can be manufactured using a patterned photoresist layer defining gate structure 19 and using an RIE chemistry comprised of $CHF_3$, $C_2F_6$, $SF_6$, or the like to etch gate structure 19. Carrier gases such as helium and nitrogen, for example, can also be introduced into the RIE chemistry. The RIE chemistry should not significantly etch dielectric layer 17. A hard mask of silicon dioxide, for example, located over gate structure 19 can also be used during the RIE process to protect gate structure 19.

Dielectric layer 17 protects the surface of substrate 11 during deposition of gate structure 19 and during etching of gate structure 19. Consequently, a higher powered RIE process can be used to etch gate structure 19 compared the lower powered RIE process used to etch dielectric layer 14. Unintentional residues from the deposition and etching process of gate structure 19 will not be left on substrate 11 because substrate 11 is covered by dielectric layer 17. The lower limit of the thickness of dielectric layer 17 is constrained by the desire to avoid pinhole formation associated with thinner layers, where dielectric layer 17 would be a less robust etch stop.

The thickness of dielectric layer 17 also can have an upper limit constrained by the loss of dimensional control due to possible undercutting of dielectric layer 17 during formation of opening 18. In the particular embodiment of the present invention represented in FIG. 3, opening 18 defines the gate length of semiconductor device 10. Therefore, tight control of the dimensions of opening 18 should be maintained due to the importance of the gate length parameter affecting the electrical performance of semiconductor device 10.

By depositing gate structure 19 directly on dielectric layer 17 instead of on another dielectric layer which overlies dielectric layer 17 as in a conventional back-filled gate process, tighter control of gate length is maintained. Furthermore, a conventional back-filled gate process does not have self-aligned source and drain regions relative to a gate structure which can drastically degrade the electrical performance of a semiconductor device. However, as described below in FIG. 5, semiconductor device 10 of the present invention can create source and drain regions which are self-aligned to a gate structure.

Gate structure 19 forms a Schottky barrier contact with substrate 11 at opening 18. The removal process of a portion of dielectric layer 17 to form opening 18 is important to form a superior Schottky barrier contact. Therefore, residues or damage from the removal process should not exist on substrate 11 within opening 18. If dielectric layer 17 were too thick and the aspect ratio of opening 18 were too large, incomplete removal of dielectric layer 17 in opening 18 may occur, or residues may be left within opening 18 during the etch process defining opening 18 which will degrade the Schottky barrier contact.

Figure 4:
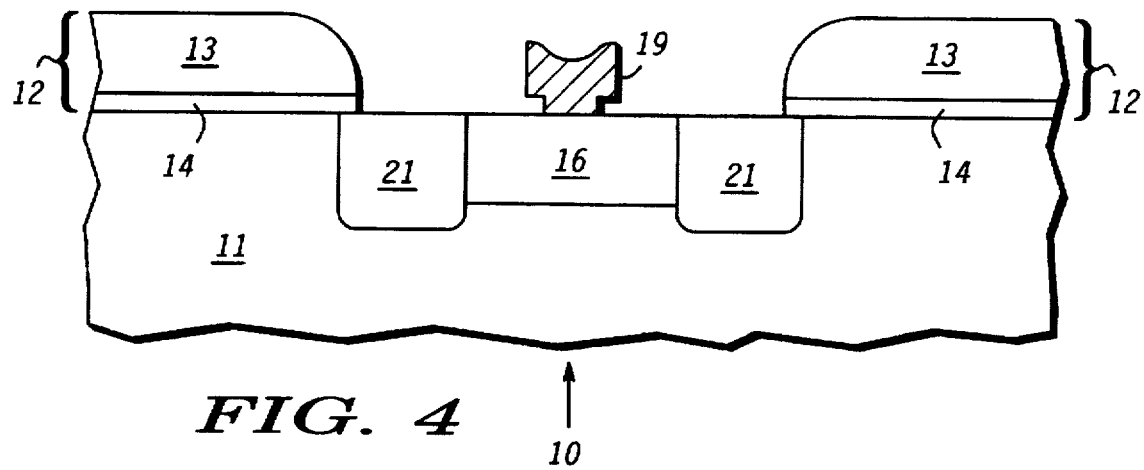

As represented by FIG. 4, dielectric layer 17 is removed from substrate 11 after formation of gate structure 19. The removal of dielectric layer 17 can be accomplished by using a similar $NH_4OH$ process described above or using other etchants which will not substantially etch gate structure 19, substrate 11, or dielectric stack 12. Prior to its removal from substrate 11, dielectric layer 17 is preferably subjected to temperatures only less than approximately 500° C. As mentioned previously, temperatures over roughly 500° C. alter dielectric layer 17 such that dielectric layer 17 is difficult to remove off of substrate 11 using an $NH_4OH$ etchant.

An optional self-aligned ion implantation can be performed to create lightly doped source and drain regions 21. Ions similar to those used to create channel region 16 are used to create lightly doped source and drain regions 21. Gate structure 19 and dielectric stack 12 are used to block the ion implantation and to define the widths of lightly doped source and drain regions 21. A patterned photoresist layer can also be used to define specific ion implantation regions as described previously. As illustrated in FIG. 4, lightly doped source and drain regions 21 can be implanted at a higher energy to extend deeper into substrate 11 compared to channel region 16, or alternatively, lightly doped source and drain regions 21 can be the same depth or even more shallow than channel region 16.

Figure 5:
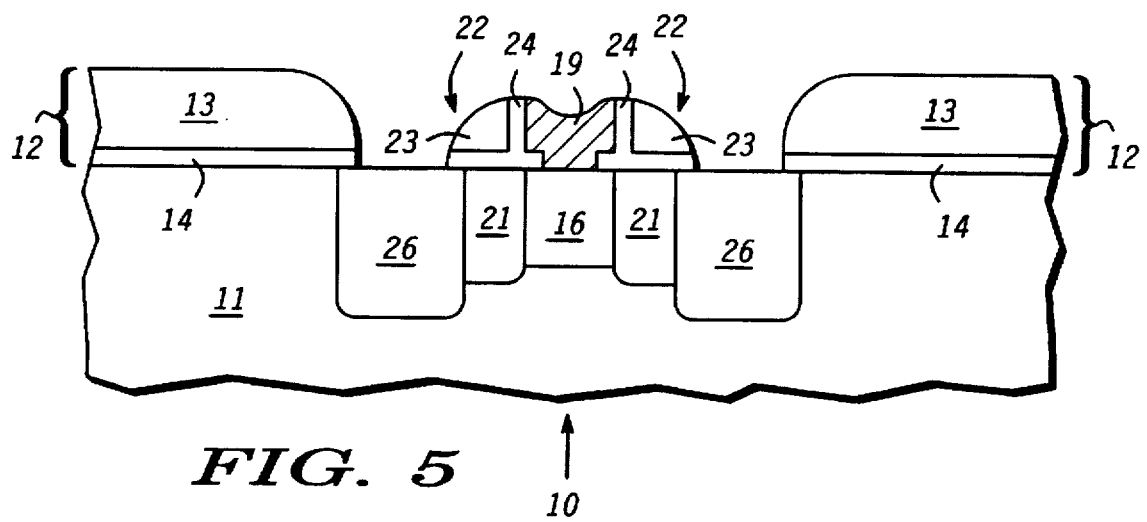

Turning to FIG. 5, spacers 22 are formed adjacent to gate structure 19 and over substrate 11. Spacers 22 comprise dielectric layers 23 and 24. First, dielectric layer 24 is disposed over substrate 11, and then dielectric layer 23 is provided over dielectric layer 24. Dielectric layers 23 and 24 preferably comprise silicon dioxide and silicon nitride, respectively. The properties of dielectric layers 23 and 24 are similar to those of dielectric layers 13 and 14, respectively, and therefore, similar substitutes and deposition processes can be used. Dielectric layers 23 and 24 are subsequently anisotropically etched to form spacers 22 as done in the art.

Source and drain regions 26 are ion implanted into substrate 11 using gate structure 19, spacers 22, and dielectric stack 12 to self-align source and drain regions 26 to gate structure 19. Ions similar to those used to create channel region 16 are used to create source and drain regions 26. As illustrated in FIG. 5, source and drain regions 26 can extend deeper into substrate 11 compared to lightly doped source and drain regions 21, or alternatively, source and drain regions 26 can be the same depth or more shallow than lightly doped source and drain regions 21 or channel region 16. Preferably, the ion implantation dosage used for source and drain regions 26 is greater than that used for lightly doped source and drain regions 21 which is greater than that used for channel region 16. A patterned photoresist layer can be used to define specific ion implantation regions as described previously. A patterned photoresist layer can also be used if gate structure 19, spacers 22, and dielectric stack 12 are not thick enough to block the ions from substrate 11 during the ion implantation of source and Finally, in FIG. 6, ohmic contacts 27 are coupled to source and drain regions 21 of semiconductor device 10. Ohmic contacts 27 comprise metals including, but not limited to nickel, germanium, gold, and tungsten and are fabricated using conventional processes. An interconnect structure (not shown) can then be formed over substrate 11 coupling multiple semiconductor devices to form an integrated circuit in substrate 11.

Figure 6:
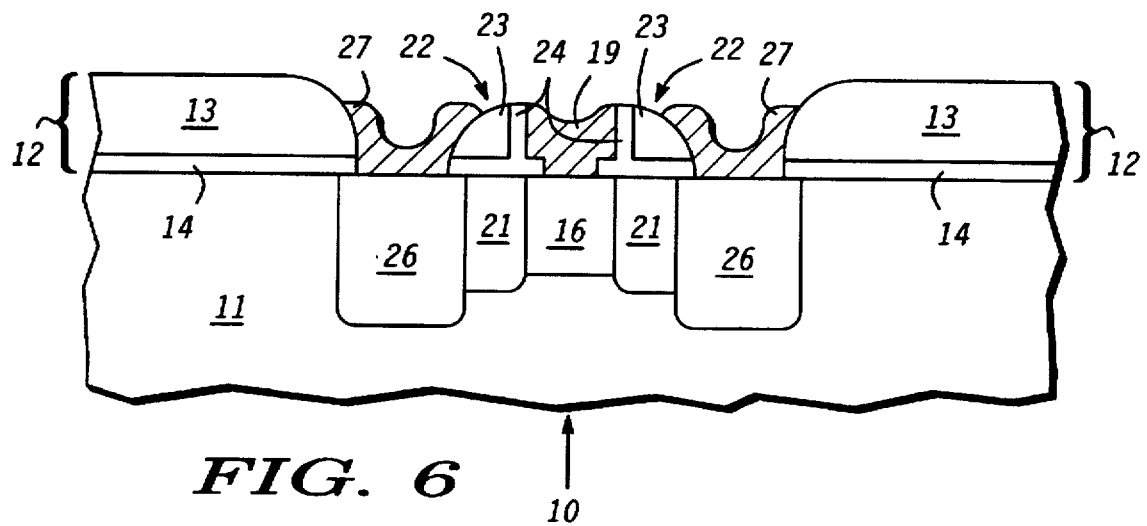

Semiconductor device 10 represents a metal-semiconductor field effect transistor (MESFET) as portrayed in FIG. 6. However, the subject invention also applies to heterojunction field effect transistors (HFETs) as portrayed in FIG. 7.

Figure 7:
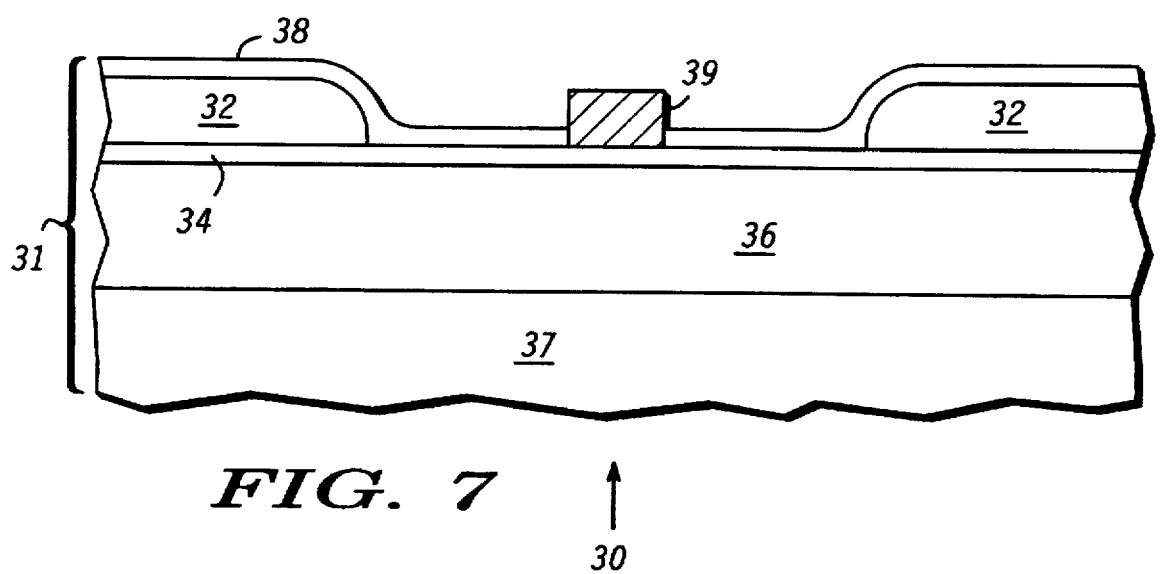
FIG. 7 represents an enlarged, cross-sectional view of an alternative embodiment of the semiconductor device.

FIG. 7 illustrates HFET 30 manufactured in substrate 31. Substrate 31 comprises epitaxial layers 32, 34, and 36 over substrate 37. Epitaxial layer 36 preferably comprises indium gallium arsenide, serves as the channel for HFET 30, and is epitaxially grown over substrate 37 which preferably comprises gallium arsenide. Epitaxial layer 34 preferably comprises aluminum gallium arsenide, is delta doped or uniformly doped with a dopant such as silicon or the like to serve as the supply layer for HFET 30, and is epitaxially grown over epitaxial layer 36. Epitaxial layer 32 preferably comprises gallium arsenide heavily doped with a dopant such as silicon or the like, and is epitaxially grown over epitaxial layer 34.

A portion of epitaxial layer 32 is removed through an etching process using citric acid and peroxide to create source and drain regions 32 of HFET 30. Subsequently, dielectric layer 38 is deposited over substrate 31. Dielectric layer 38 contains aluminum and is similar in composition and functionality to dielectric layer 17 of FIG. 2. An opening is created in dielectric layer 38 which exposes a portion of substrate 31, and a gate layer is deposited on dielectric layer 38 and over the exposed portion of substrate 31. The gate layer is etched to form gate structure 39, and then dielectric layer 38 is removed.

Gate structure 39 is similar in composition to gate structure 19 of FIG. 3. However, after etching, gate structure 39 does not overlie dielectric layer 38 while gate structure 19 does overlie dielectric layer 17. Alternatively, gate structure 39 can also be smaller than the opening in dielectric layer 38. It is noted that the physical embodiments of gate structures 19 and 39 are interchangeable.

While the subject invention has been particularly shown and described with reference to preferred embodiments, it will be understood by those skilled in the art that changes in form and detail may be made without departing from the spirit or scope of the invention. For instance, it is recognized that dielectric layers 17 and 38 of FIGS. 3 and 7, respectively, can be used as an etch stop layer for an overlying metal layer which is not a gate structure. Furthermore, if substrate 11 of FIG. 1 were semi-insulating gallium arsenide, dielectric stack 12 can be eliminated from semiconductor device 10 such that dielectric layer 17 of FIG. 2 would not be disposed over dielectric stack 12. In this alternative embodiment, a photoresist pattern would be used to define the width of channel region 16 during the ion implantation step of FIG. 1. Moreover, additional aluminum nitride layers can be incorporated into the process described above as described in the art and in U.S. Pat. No. 5,512,518 which is hereby incorporated herein by reference.

Therefore, in accordance with the present invention, it is apparent there has been provided an improved method of manufacturing a gate electrode for a semiconductor device which overcomes the disadvantages of the prior art. The present invention eliminates issues associated with a backfilled gate process, eliminates residues from the gate etch and deposition processes, eliminates substrate damage from the gate etch process, does not detrimentally affect the electrical performance of the semiconductor device, and is compatible with existing process flows.

We claim:

1. A method of manufacturing a semiconductor device, the method comprising the steps of:
   providing a substrate;
   implanting ions into the substrate to create a channel region in the substrate;
   providing a dielectric layer comprised of a metal on the substrate after implanting the ions;
   removing a portion of the dielectric layer to expose a portion of the substrate; and
   providing a gate layer on the dielectric layer and over the portion of the substrate, wherein the step of providing the gate layer includes providing the gate layer on the dielectric layer before providing a different layer on the dielectric layer.

2. The method according to claim 1, further comprising providing aluminum for the metal.

3. The method according to claim 1, further comprising providing aluminum nitride for the dielectric layer.

4. The method according to claim 1, further comprising:
   providing titanium tungsten nitride for the gate layer; and
   providing a compound semiconductor material for the substrate.

5. The method according to claim 1, further including:
   etching the gate layer to form a gate structure over the portion of the substrate; and
   removing the dielectric layer from the substrate.

6. The method according to claim 1, further including exposing the dielectric layer to temperatures only less than approximately 500° C. while the dielectric layer is over the substrate.

7. The method according to claim 1, further including forming source and drain regions in the substrate after providing the gate layer.

8. The method according to claim 1, wherein the removing step further comprises using ammonium hydroxide.

9. A method of forming a semiconductor device, the method comprising the steps of:
   providing a substrate;
   disposing a dielectric layer having a metal over the substrate; and
   disposing an electrically conductive material on the dielectric layer prior to disposing a different material on the dielectric layer.

10. The method according to claim 9, further comprising providing aluminum for the metal.

11. The method according to claim 9, further comprising removing a portion of the dielectric layer to provide an opening in the dielectric layer and wherein disposing the electrically conductive material further comprises disposing the electrically conductive material over the opening.

12. The method according to claim 11, further comprising:

using the electrically conductive material to form a gate structure over the opening; and removing the dielectric layer from the substrate.

13. The method according to claim 9, further comprising forming source and drain regions in the substrate after disposing the electrically conductive material.

14. The method according to claim 9, further comprising exposing the dielectric layer to temperatures only less than approximately 500° C. while the dielectric layer is over the substrate.

15. The method according to claim 9, further comprising providing aluminum nitride for the dielectric layer.

16. A method of manufacturing a semiconductor device, the method comprising the steps of:

providing a substrate;

implanting a channel region into the substrate;

providing an aluminum nitride layer on the substrate and over the channel region;

exposing a portion of the substrate by removing a portion of the aluminum nitride layer;

providing a gate layer physically contacting the aluminum nitride layer and the portion of the substrate after forming the channel region;

forming a gate structure from the gate layer; and removing the aluminum nitride layer from the portion of the substrate.

17. The method according to claim 16, further including forming source and drain regions in the substrate after forming the gate structure.

18. The method according to claim 16, further including exposing the aluminum nitride layer to temperatures only less than approximately 500° C. while the dielectric layer is over the substrate.

19. A method of manufacturing a semiconductor device, the method comprising the steps of:

providing a substrate:

implanting ions into the substrate to create a channel region in the substrate;

providing a dielectric layer comprised of a metal on the substrate after implanting the ions, wherein the step of providing the dielectric layer includes providing the dielectric layer with a thickness of less than approximately five hundred angstroms;

removing a portion of the dielectric layer to expose a portion of the substrate: and providing a gate layer on the dielectric layer and over the portion of the substrate.

* * * * *